United States Patent
Miyoshi et al.

(10) Patent No.: US 7,772,130 B2
(45) Date of Patent: Aug. 10, 2010

(54) INSULATION FILM FORMING METHOD, INSULATION FILM FORMING SYSTEM, AND SEMICONDUCTOR DEVICE MANUFACTURING METHOD

(75) Inventors: Hidenori Miyoshi, Nirasaki (JP); Kazuo Komura, Sodegaura (JP)

(73) Assignee: Tokyo Electron Limited, Tokyo (JP)

( * ) Notice: Subject to any disclaimer, the term of this patent is extended or adjusted under 35 U.S.C. 154(b) by 571 days.

(21) Appl. No.: 10/580,824

(22) PCT Filed: Nov. 29, 2004

(86) PCT No.: PCT/JP2004/017692

§ 371 (c)(1),
(2), (4) Date: Apr. 13, 2007

(87) PCT Pub. No.: WO2005/053008

PCT Pub. Date: Jun. 9, 2005

(65) Prior Publication Data

US 2007/0275568 A1    Nov. 29, 2007

(30) Foreign Application Priority Data

Nov. 28, 2003   (JP) ............................. 2003-399827

(51) Int. Cl.
*H01L 21/31* (2006.01)
*C23C 16/00* (2006.01)
(52) U.S. Cl. ............... 438/778; 118/715; 427/248.1; 427/446; 257/E21.001
(58) Field of Classification Search ............ 427/248.1, 427/446; 438/778; 257/E21.001; 118/715
See application file for complete search history.

(56) References Cited

U.S. PATENT DOCUMENTS

| | | | |
|---|---|---|---|
| 5,290,736 A * | 3/1994 | Sato et al. ................. 438/761 |
| 6,147,009 A | 11/2000 | Grill et al. | |
| 6,627,532 B1 * | 9/2003 | Gaillard et al. ............ 438/623 |
| 2002/0111000 A1 * | 8/2002 | Kawakami et al. ......... 438/584 |
| 2003/0057557 A1 * | 3/2003 | Matsunaga et al. ........ 257/758 |
| 2003/0207131 A1 | 11/2003 | Nakata et al. | |

FOREIGN PATENT DOCUMENTS

| | | |
|---|---|---|
| CN | 1366709 | 8/2002 |
| JP | 09-298241 | 11/1997 |
| JP | 10-092804 | 4/1998 |
| JP | 2000-068264 | 3/2000 |
| JP | 2000-150510 | 5/2000 |
| JP | 2001-035917 | 2/2001 |
| JP | 2003-100757 | 4/2003 |

OTHER PUBLICATIONS

Japanese Office Action from application No. 2004800307372.

* cited by examiner

*Primary Examiner*—Hsien-ming Lee
*Assistant Examiner*—Walter H Swanson
(74) *Attorney, Agent, or Firm*—Finnegan, Henderson, Farabow, Garrett & Dunner, LLP

(57) ABSTRACT

In a CVD apparatus (111), a reforming process is performed on a porous low dielectric constant film containing silicon, by heating a semiconductor wafer W by a heater, introducing 1,3,5,7-tetramethylcyclotetrasiloxane (TMCTS), and performing heat treatment without applying a high frequency voltage. Then, in the same CVD apparatus (111), an insulation film having high density and hardness is formed on the porous low dielectric constant film, by heating the semiconductor wafer W, introducing TMCTS, and generating a plasma of a gas containing TMCTS while applying a high frequency voltage.

24 Claims, 7 Drawing Sheets

○ : Holes  ● : Monomer Or Polymer In Low Degree Of Polymerization
● : Polymer In Middle Degree Of Polymerization
● : Polymer In High Degree Of Polymerization

INSULATION FILM FORMING METHOD, INSULATION FILM FORMING SYSTEM, AND SEMICONDUCTOR DEVICE MANUFACTURING METHOD

TECHNICAL FIELD

The present invention relates to a film forming method, a film forming apparatus, etc. capable of forming different types of insulation films with high efficiency, and particularly relates to an insulation film forming method and an insulation film forming system suitable for reforming a low dielectric constant film and forming an insulation film different in film property on the low dielectric constant film.

BACKGROUND ART

In order to improve the processing speed of a semiconductor integrated circuit, it is necessary to achieve a low R/C time constant. Resistance R is lowered by using copper low in resistivity as wiring material, while electrostatic capacitance C is lowered by using an insulation film (low dielectric constant film) having a low dielectric constant K as an interlayer insulation film. Further, with the use of a low dielectric constant film, it is possible to prevent a crosstalk.

A porous insulation film enhanced in its rate of holes included is widely used as an insulation film having a low dielectric constant. However, a porous insulation film has a problem that it generally lacks strength and is highly hygroscopical due to its structure. Hence, many researches are made on a reforming method for hydrophobizing and strengthening the porous insulation film.

For example, the specification of U.S. Pat. No. 6,147,009 discloses a technique for forming an SiOC film by performing chemical vapor deposition (CVD) by plasma using 1,3,5,7-tetramethylcyclotetrasiloxane (TMCTS). However, there is a problem that it is difficult to form a film having an extremely low dielectric constant since porosity is hard to obtain if a CVD method is used.

A copper wiring is formed by forming a hard mask high in hardness and density on a low dielectric constant porous film by a damascene process, then performing etching by photolithography, and embedding a wiring in a groove formed by etching. The copper wiring is formed together with forming a barrier metal layer in the groove for preventing copper diffusion. However, in the porous film, the very barrier metal layer might be diffused. Unexamined Japanese Patent Application KOKAI Publication No. H9-298241 discloses providing a silicon oxide film to prevent diffusion of wiring materials into the porous film. Hereinafter, an insulation film having the same function as this silicon oxide film, i.e., capable of preventing diffusion of wiring materials (metals) will be referred to as sealing film.

According to a conventional film forming method, for reforming a porous film to further stack thereon an insulation film (a hard mask or a sealing film) different from the porous film in film property, the porous insulation film is reformed in a different chamber by using a different reaction substance, and another insulation film (a hard mask or a sealing film) is formed on the porous insulation film, resulting in a problem that the apparatus needs to be large in size and many process steps are involved.

A similar problem has been suffered also in a case where a low dielectric constant film, not only in case of it being a porous insulation film, is reformed to form thereon another insulation film (a hard mask, a sealing film, or a passivation film), etc. having a different film property.

DISCLOSURE OF INVENTION

The present invention was made in view of the above-described circumstance, and an object of the present invention is to make it possible to efficiently perform a process for reforming a low-dielectric constant film and a process for forming another insulation film having a different film property on the low dielectric constant film as reformed.

To achieve the above object, an insulation film forming method according to a first aspect of the present invention comprises:

a heat treatment step of heating a first insulation film in an atmosphere containing a reaction substance; and a film forming step of forming a second insulation film on the first insulation film subjected to a heat treatment in the heat treatment step, by chemical vapor deposition (CVD) using a gas containing the reaction substance.

In the above-described method, the film forming step comprises, for example, a step of causing chemical vapor deposition by exciting the reaction substance by an energy higher than that for exciting the reaction substance in the heat treatment step.

In the above-described method, for example, in the heat treatment step, the first insulation film is subjected to the heat treatment in an atmosphere substantially containing no plasma, and in the film forming step, a plasma of the gas containing the reaction substance is generated to perform chemical vapor deposition.

In the above-described method, for example, the first insulation film is formed of a porous insulation film, the heat treatment step comprises a reforming step of reforming the porous insulation film by causing the reaction substance to combine with the porous insulation film, and the film forming step comprises a step of placing the reformed first insulation film in the atmosphere containing the reaction substance to heat the first insulation film, and generating a plasma of the gas containing the reaction substance to cause chemical vapor deposition of the reaction substance on the first insulation film.

The reaction substance comprises, for example, a reaction substance which is in a gaseous state at a normal temperature under a normal pressure, or whose vapor pressure at a normal temperature is 1 Pa to 101.3 kPa, preferably 100 Pa to 101.3 kPa.

Further, the reaction substance comprises, for example, a substance containing silicon and hydrogen. In this case, it is preferable that the reaction substance comprise a substance containing two or more silicon-hydrogen bonds.

Further, it is preferable that the reaction substance comprise a substance containing 1 to 30 silicon atoms, and an element obtained from hydrogen, oxygen, and nitrogen.

For example, the reaction substance comprises at least one kind of cyclic siloxane expressed by

[Chemical Formula 1]

(where $R^{11}$, $R^{12}$, $R^{13}$, $R^{14}$, $R^{15}$, and $R^{16}$ may be the same or may be different, and each represents H, OH, $C_6H_5$, $C_aH_{2a+1}$, $C_bH_{2b+1}$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, L is an integer from 0 to 8, m is an integer from 0 to 8, n is an integer from 0 to 8, and $3 \leq L+m+n \leq 8$).

Note that the reaction substance is not limited to those above, but, for example, such a substance is also usable, which comprises at least one kind of silicon compound expressed by

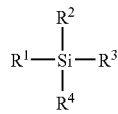

[Chemical Formula 2]

(where $R^1$, $R^2$, $R^3$ and $R^4$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, and e is an integer from 2 to 4).

Further, as the reaction substance, for example, such a substance is also usable, which comprises at least one kind of silicon compound expressed by

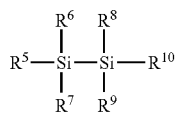

[Chemical Formula 3]

(where $R^5$, $R^6$, $R^7$, $R^8$, $R^9$, and $R^{10}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, and e is an integer from 2 to 4).

Further, as the reaction substance, for example, such a substance is also usable, which comprises at least one kind of silicon compound expressed by

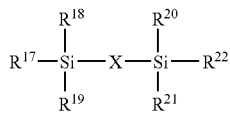

[Chemical Formula 4]

(where $R^{17}$, $R^{18}$, $R^{19}$, $R^{20}$, $R^{21}$ and $R^{22}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, X is O, $(CH_2)_f$, $C_6H_4$, $(OSiR^{23}R^{24})_nO$, $OSiR^{25}R^{26}YSiR^{27}R^{28}O$, or $NR^{29}$, where $R^{23}$, $R^{24}$, $R^{25}$, $R^{26}$, $R^{27}$, $R^{28}$ and $R^{29}$ may be the same or may be different and each represents H, OH, $C_6H_5$, $C_aH_{2a+1}$, $C_bH_{2b+1}O$, $CF_3(CF_2)_c(CH_2)_d$, $C_eH_{2e-1}$, a halogen atom, or $OSiR^{30}R^{31}R^{32}$, a is an integer from 1 to 3, b is an integer from 1 to 3, c is an integer from 0 to 10, d is an integer from 0 to 4, e is an integer from 2 to 4, f is an integer from 1 to 6, n is an integer from 1 to 10, Y represents $(CH_2)_m$ or $C_6H_4$, m is an integer from 1 to 6, and $R^{30}$, $R^{31}$, and $R^{32}$ may be the same or may be different and each represents H or $CH_3$).

Further, as the reaction substance, for example, such a substance is also usable, which comprises at least one kind of cyclic silazane expressed by

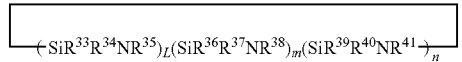

[Chemical Formula 5]

(where $R^{33}$, $R^{34}$, $R^{35}$, $R^{36}$, $R^{37}$, $R^{38}$, $R^{39}$, $R^{40}$, and $R^{41}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e, is an integer from 2 to 4, L is an integer from 0 to 8, m is an integer from 0 to 8, n is an integer from 0 to 8, and $3 \leq L+m+n \leq 8$).

Further, the reaction substance is, for example, 1,3,5,7-tetramethylcyclotetrasiloxane.

The first insulation film may be formed of a porous insulation film containing silicon, and the reaction substance may comprise 1,3,5,7-tetramethylcyclotetrasiloxane.

The first insulation film may constitute an interlayer insulation film of a semiconductor device, and the second insulation film may constitute an insulation film which is higher in at least one of hardness and density, than the first insulation film.

The heat treatment step may include a step of changing a mean molecular weight of the reaction substance in the atmosphere (for example, serially, stepwise), along with elapse of a time for heat treatment.

The first insulation film, which is a process target of the heat treatment in the heat treatment step, may be formed of a porous insulation film formed by spin coating, or a porous insulation film formed by chemical vapor deposition (CVD).

An insulation film forming method according to a second aspect of the present invention comprises:

a reforming step of reforming a porous film containing silicon by heating the porous film while placing it in an atmosphere containing 1,3,5,7-tetramethylcyclotetrasiloxane; and a film forming step of placing the reformed porous film in the atmosphere containing 1,3,5,7-tetramethylcyclotetrasiloxane, and forming an insulation film higher in at least one of hardness and density than the reformed porous film on the porous film, by chemical vapor deposition using a gas containing the 1,3,5,7-tetramethylcyclotetrasiloxane.

In the reforming step, a plasma of the atmosphere gas containing 1,3,5,7-tetramethylcyclotetrasiloxane may not be generated, and in the film forming step, a plasma of the gas containing 1,3,5,7-tetramethylcyclotetrasiloxane may be generated to perform chemical vapor deposition.

To achieve the above object, an insulation film forming system according to a third aspect of the present invention comprises: a first chamber, a first support member arranged inside the first chamber for supporting a process target, a first heater which heats the process target supported by the first support member; first gas supply means for supplying a gas containing a predetermined reaction substance into the first chamber; first control means for introducing the gas containing the reaction substance into the first chamber by the first gas supply means in a state where a first insulation film is placed on the first support member, and heating the first insulation film by the first heater; a second chamber, a second support member arranged inside the second chamber for supporting a process target, a second heater which heats the process target supported by the second support member; second gas supply means for supplying a gas containing the reaction substance into the second chamber; and second control means for introducing the gas containing the reaction substance into the second chamber by the second gas supply means in a state where the first insulation film is supported on the second support member, and forming a second insulation film containing a product of the reaction substance on the first insulation film.

Plasma generation means (131, 139) for generating a plasma of the gas containing the reaction substance in the second chamber may further be included, and the second control means may introduce the gas containing the reaction substance into the second chamber by the second gas supply means in a state where the first insulation film is placed on the second support member, may heat the first insulation film by the second heater, and may generate a plasma of the gas containing the reaction substance by the plasma generation means, thereby forming the second insulation film containing the product of the reaction substance on the first insulation film.

The first and second chambers may be physically constituted by a single chamber, the first and second support members may be physically constituted by a single support member, the first and second heaters may be physically constituted by a single heater, the first and second control means may be physically constituted by a common control unit, the chamber may comprise high frequency electric field applying means for applying a high frequency electric field to a gas introduced into the chamber, the control unit may comprise means for controlling the high frequency electric field applying means so as not to apply a high frequency electric field to the gas at a time of heat treatment, and to apply a high frequency electric field at a time of film formation, and the system may be capable of performing reformation of the first insulation film and forming the second insulation film on the reformed first insulation film, by a single set of components.

EXPLANATION OF REFERENCE NUMERALS

| | |
|---|---|
| 11 | film forming apparatus |
| 12 | spin coating chamber |
| 13 | CVD apparatus |
| 14 | conveying chamber |
| 15 | carry-in/carry-out chamber |
| 17 | conveying arm |
| 100 | control unit |
| 112 | chamber |
| 116 | susceptor |
| 117 | heater |
| 131 | showerhead |
| 135 | gas inlet pipe |
| 139 | high frequency power source |
| 140 | matching box |
| 211 | porous low dielectric constant film |
| 213 | hard mask |
| 225 | copper wiring |
| 231 | wiring opening |
| 234 | copper wiring |
| 227 | porous low dielectric constant film |
| 228 | hard mask |
| 311 | porous low dielectric constant film |

BEST MODE FOR CARRYING OUT THE INVENTION

First Embodiment

A film forming apparatus 11 according to an embodiment of the present invention will be explained with reference to the drawings.

Figure 1:
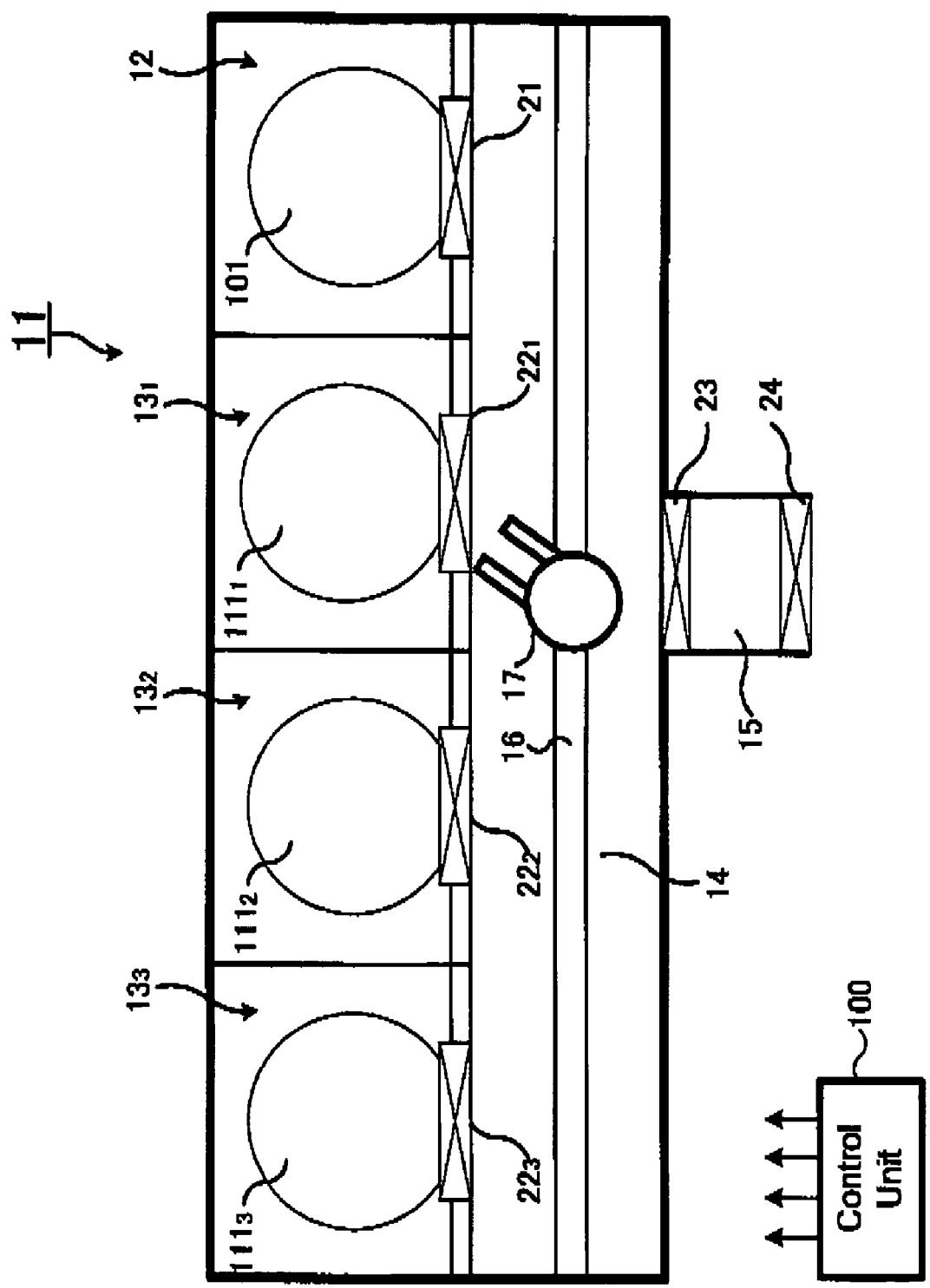
[FIG. 1] is a diagram showing a system structure of a film forming apparatus according to an embodiment of the present invention.

As shown in FIG. 1, the film forming apparatus 11 comprises a spin coating chamber 12, a plurality of (three in the drawing) CVD chambers 13 (13$_1$ to 13$_3$), a conveying chamber 14, a carry-in/carry-out chamber 15, a conveying rail 16, a conveying arm 17, and a control unit 100.

The spin coating chamber 12 is connected to the conveying chamber 14 via a gate (gate valve) 21, and equipped there inside with a spin coating (coater) apparatus 101, which, when a semiconductor wafer is placed on a rotation table, drips a porous silica film forming material onto the semiconductor wafer while rotating the semiconductor wafer at high speed, thereby to form a porous silica film having a generally uniform thickness.

The CVD chambers 13 (13$_1$ to 13$_3$) are connected to the conveying chamber 14 respectively via gates 22 (22$_1$ to 22$_n$, e.g., 22$_1$ to 22$_3$), and a CVD (Chemical Vapor Deposition) apparatus 111 is placed thereinside.

Figure 2:
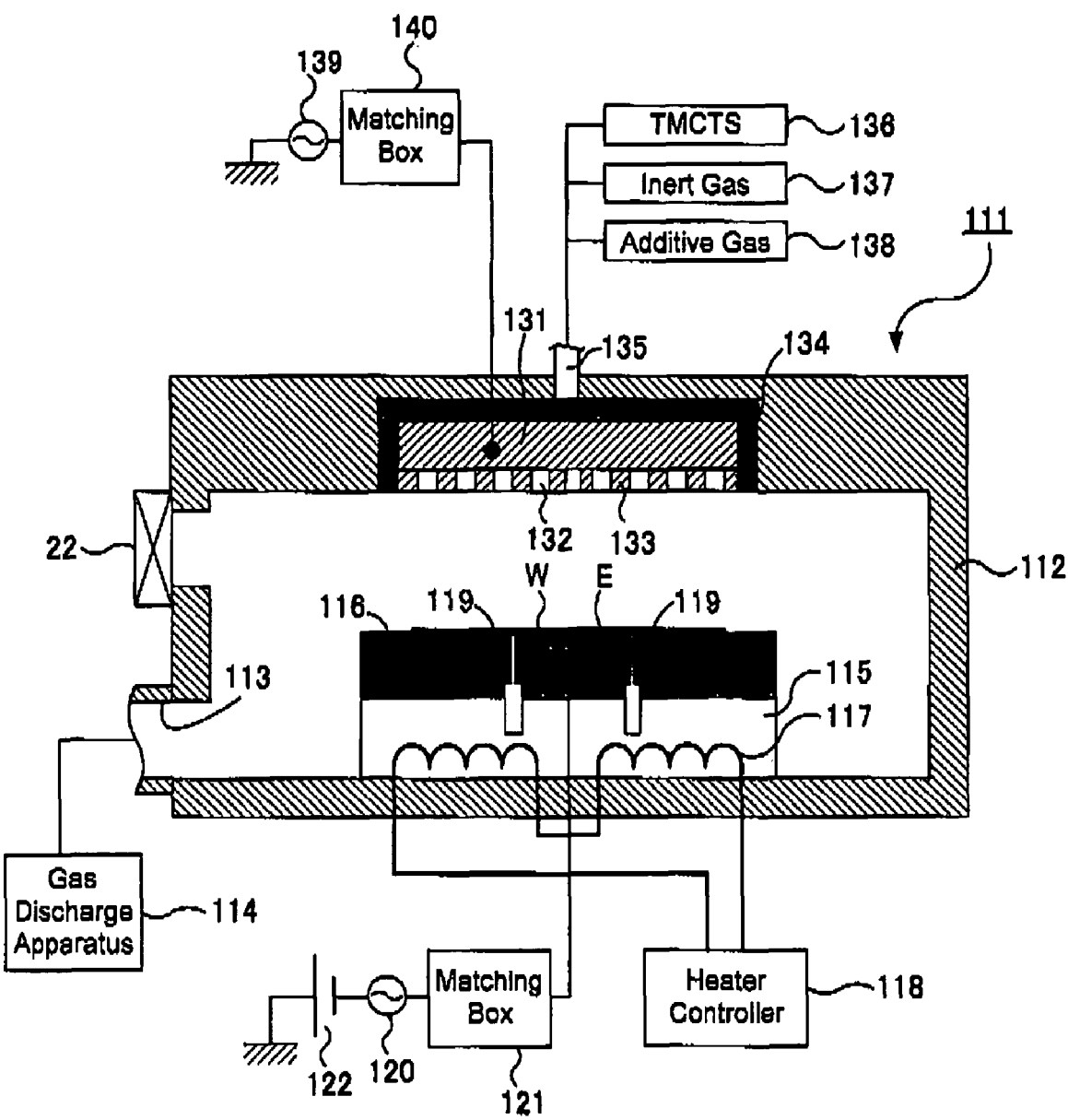
[FIG. 2] is a diagram showing one example of a CVD apparatus shown in FIG. 1.

Each CVD apparatus 111 is a so-called parallel-plate plasma CVD apparatus, and has a chamber 112 having a circular cylindrical shape, as shown in FIG. 2. The chamber 112 is made of a conductive material such as aluminum subjected to alumite treatment (anodization), etc.

A gas discharge port 113 is formed at the bottom portion of the chamber 112. A gas discharge apparatus 114 having a vacuum pump such as a turbo molecular pump, etc. is connected to the gas discharge port 113. The gas discharge apparatus 114 deaerates the chamber 112 to a predetermined pressure. The gate 22 (22$_1$ to 22$_n$) is provided on the side wall of the chamber 112. With the gate 22 opened, a wafer W is carried in and out between the chamber 112 and the external area (conveying chamber 14).

A susceptor support base 115 having a generally circular-cylindrical shape is provided on the bottom of the chamber 112. A susceptor 116, as a table (support table) on which a wafer W is placed, is provided on the susceptor support base 115. The susceptor 116 is made of insulative ceramic or the like such as alumina, etc., and has a lower electrode E arranged thereinside.

A heater 117 is provided inside the susceptor support base 115. The heater 117 generates heat when energized by a heater controller 118, and the susceptor 116 and the wafer W are controlled to a desired temperature.

The susceptor 116 has a lift pin 119 for passing or receiving the semiconductor wafer W, and the lift pin 119 can be lifted up and down by a cylinder (unillustrated).

A first high frequency power source 120 is connected, via a first matching box 121, to the lower electrode E embedded in the susceptor 116. The first high frequency power source 120 has a frequency ranging from 0.1 to 13 MHz. A direct-current power source 122 is serially connected to the first high frequency power source 120.

Due to this, a direct-current voltage is applied to the lower electrode E, making it function as an electrostatic chuck.

A showerhead 131 is provided above the susceptor 116 so as to face the susceptor 116 in parallel therewith.

An electrode plate 133 having multiple gas holes 132 is provided in a surface of the showerhead 131 facing the susceptor 116. The showerhead 131 is fixed on the ceiling of the chamber 112 by an electrode support member 134.

A gas inlet pipe 135 is connected to the showerhead 131. The gas inlet pipe 135 is connected to a TMCTS (1,3,5,7-tetra methyl cyclo tetra siloxane) gas source 136, an inert gas source (for example, a helium (He) gas source, an argon (Ar) gas source, a nitrogen ($N_2$) gas source) 137, and an additive gas source 138 for another additive gas (for example, $O_2$, $N_2O$, $NH_3$, $H_2$, etc.) via unillustrated mass flow controllers, valves, or the like.

The process gases from the respective gas sources 136 to 138 are mixed into a hollow portion (unillustrated) formed inside the showerhead 131 through the gas inlet pipe 135, and then supplied. The gases supplied into the showerhead 131 are diffused in the hollow portion and supplied from the gas holes 132 of the showerhead 131 onto the surface region of the wafer W in the chamber 112.

A second high frequency power source 139 is connected to the showerhead 131, and has a second matching box 140 on its power supply line. The second high frequency power source 139 has a frequency ranging from 13 MHz to 2.45 GHz. With such a high frequency applied, the showerhead 131 functions as an upper electrode and forms a plasma having a favorable dissociated state and high density in the chamber 112.

The conveying chamber 14 is provided in order to joint the spin coating chamber 12 and the respective CVD chambers 13, and convey a spin-coated semiconductor wafer W from the spin coating chamber 12 to the CVD apparatus 111 in any of the CVD chambers 13. The conveying chamber 14 has the conveying arm 17, which can move along the conveying rail 16. The conveying arm 17 moves inside the conveying chamber 14 to convey the semiconductor wafer W.

The carry-in/carry-out chamber 15 is provided in order to carry in or carry out the semiconductor wafer W as a process target, between the film forming apparatus 11 and the outside. The process target semiconductor wafer W is carried into the carry-in/carry-out chamber 15 with a gate 24 opened, and is picked up by the conveying arm 17 with the gate 24 closed and a gate 23 opened. A processed semiconductor wafer W is carried into the carry-in/carry-out chamber 15 from the conveying chamber 14 by the conveying aft 17 with the gate 23 opened, and then carried out to the outside with the gate 23 closed and the gate 24 opened.

The control unit 100 is constituted by a process controller comprising a microprocessor, a control memory, etc., and controls the operation of the film forming apparatus 11 on the whole. The control unit 100 controls conveying of the semiconductor wafer W by the conveying arm 17, opening and closing of the gates 21, 22, 23, and 24, the spin coating process by the spin coating apparatus 101, and processes by the CVD apparatus 111 for reforming a porous low dielectric constant film and for forming a hard mask layer on the porous low dielectric constant film.

Next, a method for forming an insulation film by the film forming apparatus 11 having the above-described structure will be explained.

Figure 3:
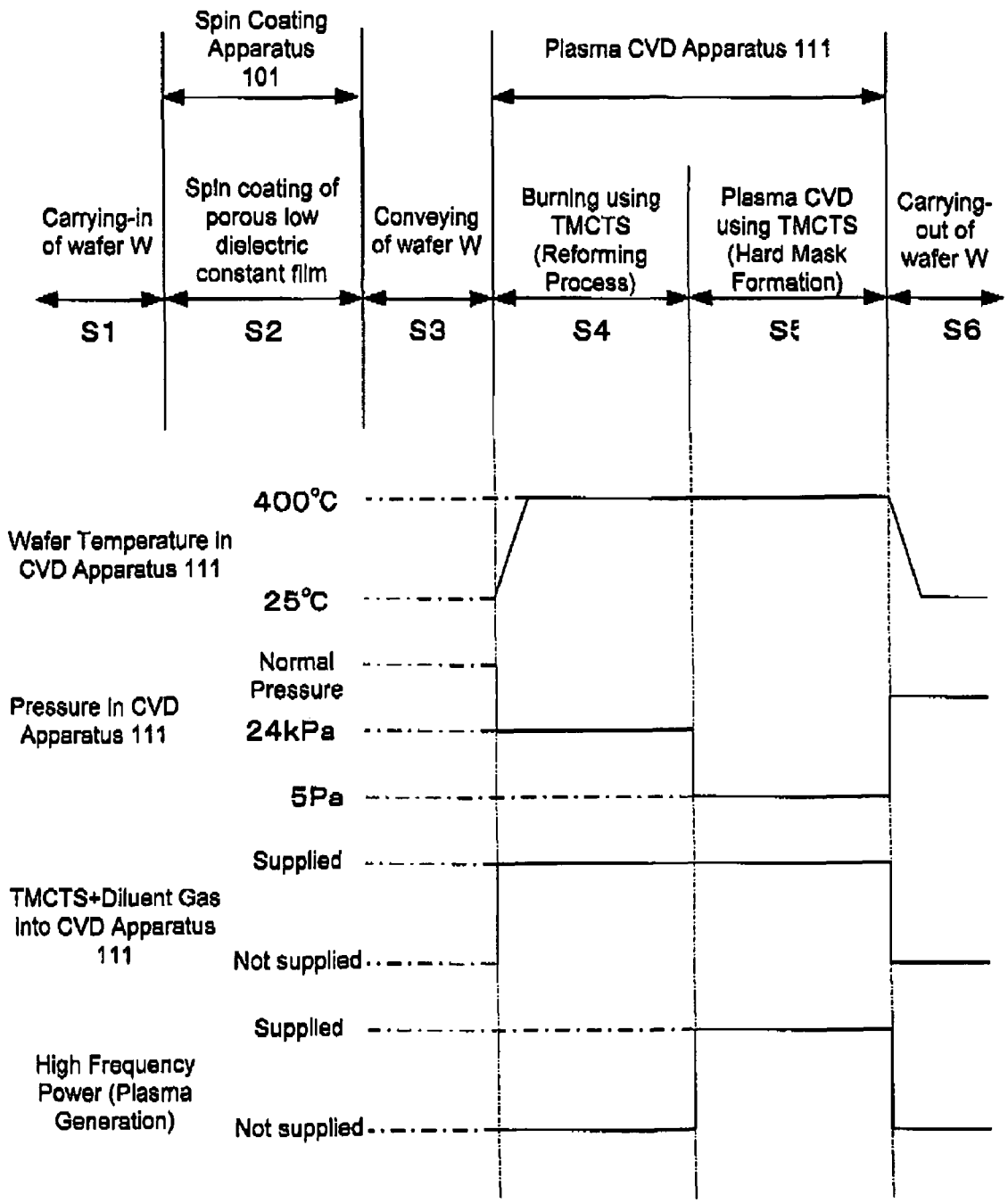
[FIG. 3] is a diagram showing an example of a recipe of a process according to a first embodiment of the present invention.

Schematically, the film forming process by the film forming apparatus 11 is made up of six steps, as shown in a procedural diagram of FIG. 3. The process target semiconductor wafer W is carried in at step S1, and the spin coating process using a solution of a porous low dielectric constant film material is performed by the spin coating apparatus 101 at step S2. The semiconductor wafer W is conveyed from the spin coating apparatus 101 to the CVD apparatus 111 at step S3. The process for reforming the porous low dielectric constant film is performed by the CVD apparatus 111 at step S4, and a hard mask is formed by the CVD apparatus 111 at step S5. The semiconductor wafer W, having been processed, is carried out at step S6.

Each step will be explained in more detail below.

The following procedures are all performed by the control unit 100 based on a process control program stored therein. However, in order to facilitate understanding, point-by-point reference to the control unit 100 will be avoided.

Step S1:

The gate 24 is opened to carry the process target semiconductor wafer W into the carry-in/carry-out chamber 15, and the gate 24 is closed. The gate 23 is opened, so that the conveying arm 17 picks up the semiconductor wafer W and conveys it, and the gate 21 is opened, so that the semiconductor wafer W is placed on the turn table of the spin coating apparatus 101 in the spin coating chamber 12.

Figure 4:
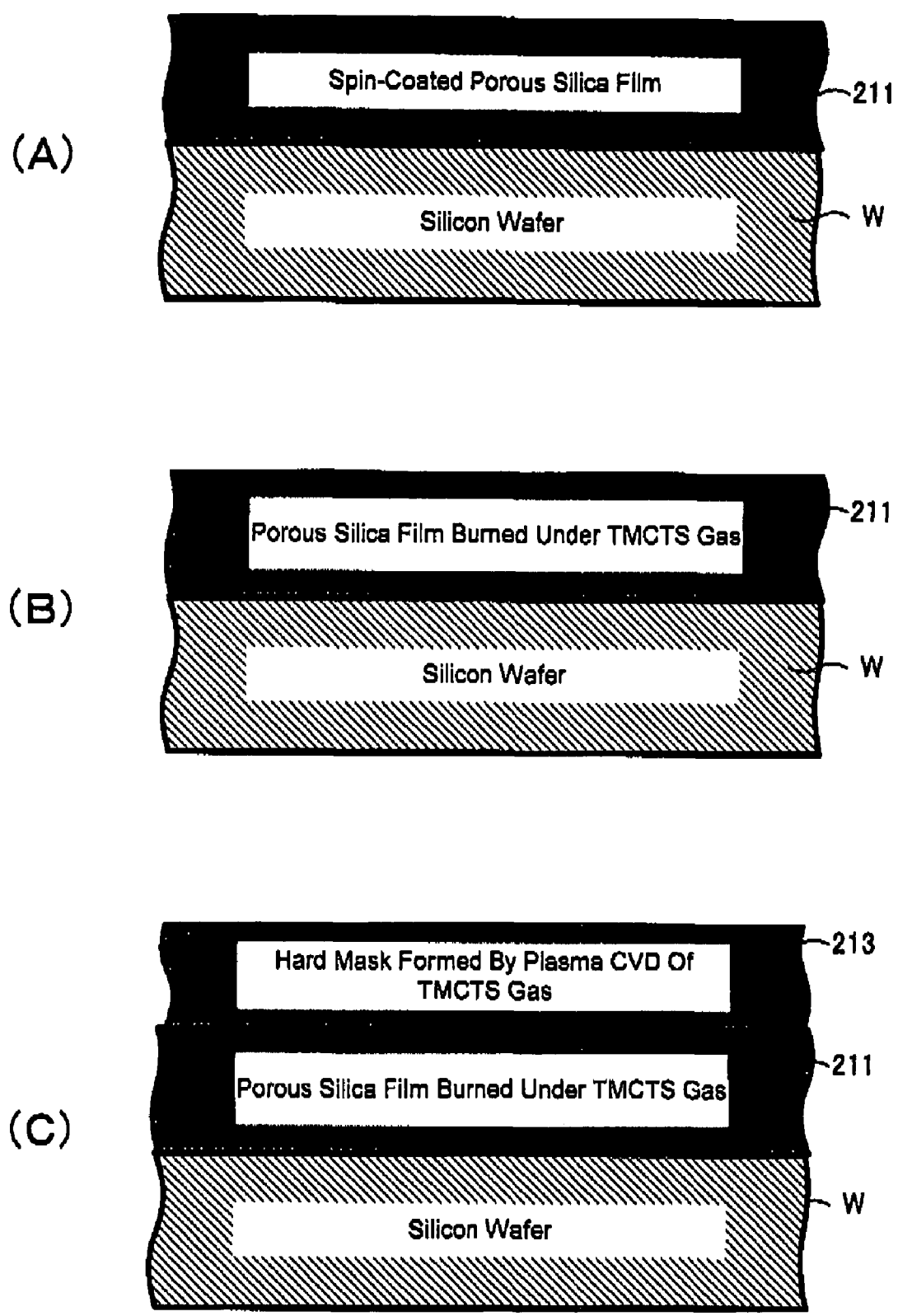
[FIG. 4] are cross-sectional views of resultant products for explaining steps of the process according to the first embodiment of the present invention.

Step S2:

The turn table is rotated to gain a predetermined rotation speed, at which a predetermined amount of the solution of the porous low dielectric constant film material is dripped onto the upper surface of the semiconductor wafer W to form a coated film of the material solution while it is rotated for a predetermined period of time. When the coated film is dried and a porous low dielectric constant film 211 having a predetermined thickness is formed on the semiconductor wafer W as shown in FIG. 4(A), the rotation of the turn table is stopped.

Known silica compounds can be used as the porous low dielectric constant film material, or for example, an element such as carbon C, hydrogen H, nitrogen N, fluorine F, etc. may be contained in the material. That is, the formed porous low dielectric constant film 211 comprises an element, for example, carbon C, hydrogen H, nitrogen N, fluorine F, etc. in addition to silicon Si and oxygen O.

Step S3:

The gate 22 is opened, and the conveying arm 17 takes out the semiconductor wafer W on which the porous low dielectric constant film 211 has been coated and formed, from the turn table. The gate 22 is closed, and the wafer W is placed on the protruding lift pin 119 of the susceptor 116 of the CVD apparatus 111 in a CVD chamber 13, which is unused at that time.

Then, the gate 22 is closed.

Step S4:

The lift pin 119 is lifted down to place the semiconductor wafer W on the susceptor 116.

Then, the heater 117 is energized via the heater controller 118 to heat the susceptor 116 and the semiconductor wafer W to, for example, 200° C. to 500° C., preferably to around 400° C.

Meanwhile, the pressure inside the chamber 112 is depressurized to 10 Pa to 100 kPa, preferably to about 24 kPa.

Further, TMCTS gas, set to be TMCTS/diluent gas (here, $N_2$ gas)=about 0.001 to 0.1, preferably about 0.005, is supplied into the chamber 112.

With this state maintained for 0.5 minute to 3 hours (preferably, about 2 minutes), the porous low dielectric constant film 211 is reformed (hydrophobized, strengthened), as shown in FIG. 4(B).

Step S5:

Then, the heater 117 is energized via the heater controller 118 to maintain the susceptor 116 and the semiconductor wafer W at, for example, 200° C. to 500° C., preferably at around 400° C.

Meanwhile, the pressure inside the chamber 112 is depressurized to 0.1 Pa to 100 Pa, preferably to about 5 Pa.

Then, the TMCTS gas, set to be TMCTS/diluent gas (here, He gas)=about 0.001 to 1.0, preferably about 0.005, is supplied into the chamber 112.

Electricity of totally 1W to 1000W, preferably about 50W is supplied to the lower electrode E and the upper electrode (electrode plate 133) to generate plasma, and this state is maintained for 0.5 minute to 1 hour. Accordingly, the plasma produces active species such as TMCTS radicals and ions, etc., which are then polymerized near the surface of the semiconductor wafer W, and the resultant product is deposited on the porous low dielectric constant film 211. That is, as shown in FIG. 4(C), a hard mask 213 made of SiOC is formed on the porous low dielectric constant film 211 by a CVD method.

The hard mask 213 thusly formed is higher in hardness and density than the porous low dielectric constant film 211, and has a preferable contact with the porous low dielectric constant film 211.

Step S6:

When the film forming process has been continued for a desired period of time, the supply of the high frequency power is stopped, the heater 117 is turned off, and the gas supply is stopped. The interior of the chamber 112 is purged to restore the normal pressure, and the lift pin 119 is lifted up.

Then, the gate 22 is opened, and the conveying arm 17 takes out the processed semiconductor wafer W from the CVD apparatus 111. The gate 23 is opened to convey the wafer W into the carry-in/carry-out chamber 15, and the gate 24 is opened to carry out the wafer W from the film forming apparatus 11.

As described above, according to the present embodiment, the processes for reforming (hydrophobizing, strengthening) the porous low dielectric constant film 211 and for forming the hard mask 213 can be performed with the use of one CVD apparatus 111 and a common reaction substance (TMCTS).

Note that the kinds of the diluent gases are arbitrary, and not limited to the above-described embodiment. Further, if necessary, an additive gas of an appropriate kind may be supplied from the additive gas source 138 into the chamber 112.

Second Embodiment

In the first embodiment, a case has been explained where the processes for reforming the porous low dielectric constant film 211 and for forming the hard mask 213 are performed using a common reaction substance. However, the present invention is not limited to this, but can be modified and applied in various manners.

An embodiment will be explained below, in which reforming of a damascene-process-applied porous low dielectric constant interlayer insulation film to which a copper wiring is to be laid, and forming of a sealing layer for preventing diffusion of the copper wiring and a barrier metal layer are performed by using a common reaction substance (TMCTS) and a common CVD apparatus.

Step S11:

A semiconductor wafer W, which is the process target, is conveyed into the spin coating apparatus 101.

Here, the semiconductor wafer W has had a hard mask 222 formed, by a damascene process, on an insulation film 221 having been formed on the semiconductor wafer W, with a wiring groove 223 formed in the film 221 and mask 222, a barrier metal layer 224 formed on the inner surface of the wiring groove 223, and a copper wiring 225 formed in the barrier metal layer 224. And an etch stopper film 226 has been formed on the hard mask 222.

A porous low dielectric constant film 227 made of, for example, porous inorganic silica, porous organic silica, or the like is formed on this structure by the spin coating apparatus 101 in a similar manner to that of the first embodiment. Further, a hard mask 228 is formed on the porous low dielectric constant film 227 by CVD or the like, to manufacture a structure whose cross section is shown in FIG. 5(A).

Step S12:

The above-described structure is conveyed to unillustrated photolithography apparatus and etching apparatus placed inside a film forming apparatus 11 to be subjected to a photolithograph process and an etching process. In the etching process, etching is done till the etch stopper film 226 to form a wiring opening 231 as shown in FIG. 5(B). Then, the structure shown in FIG. 5(B) is moved to a cleaning apparatus to be subjected to a cleaning process in order to remove etching residue.

Step S13:

The above-described structure is conveyed to the CVD apparatus 111, and as shown in FIG. 5(C), a process for reforming the porous low dielectric constant film 227 is performed by a heat treatment in an atmosphere containing TMCTS, like the first embodiment.

Step S14:

A sealing film 232 having a high density and a high hardness and capable of preventing diffusion of a barrier metal is formed on at least the inner surface of the wiring opening 231 as shown in FIG. 5(D), by a CVD method using plasma performed in an atmosphere containing TMCTS.

Step S15:

The bottom portion of the sealing film 232 and the etch stopper film 226 are etched by anisotropic vapor-phase etching to expose the upper surface of the copper wiring 225, as shown in FIG. 5(E).

Step S16:

A barrier metal layer 233 is formed on the internal surface (side wall) of the wiring opening 231 to form a copper wiring 234 as shown in FIG. 5(F).

As explained above, according to the present embodiment, a semiconductor device, in which the porous low dielectric constant film 227 is formed on the barrier metal layer and then a wiring opening is formed, can be subjected to the processes for reforming (hydrophobizing, strengthening) the porous low dielectric constant film 227 and for forming the sealing film 232, by using one CVD apparatus and a common reaction substance (TMCTS).

Further, according to the present film forming method, it can be expected that the TMCTS treatment on the porous silica film be performed uniformly thickness-wise, making it possible to strengthen the porous silica film entirely.

According to the above-described embodiment, since etching is not performed into the etch stopper film at the first etching, there is no need of removing etching residual substances including copper at the first cleaning. Since cleaning of a porous film normally requires that the chemical resistance of the porous film and the chemical's performance for removing copper are both satisfactory, there are limited cleaning liquids available that can be used. However, according to the present method, since there is no need for the performance of separating copper residue at the first cleaning, various kinds of cleaning liquids are usable.

Further, in the cleaning after the second etching, the porous film is protected by the sealing film formed by the CVD method using TMCTS. Since the cleaning chemical resistance of the sealing film is superior to the chemical resistance of the porous film, the porous film is protected from the cleaning liquid.

Furthermore, since the porous film is sealed by the sealing film, it becomes harder for the metal material to diffuse into the porous film at the time of forming the barrier metal film.

Figure 5:
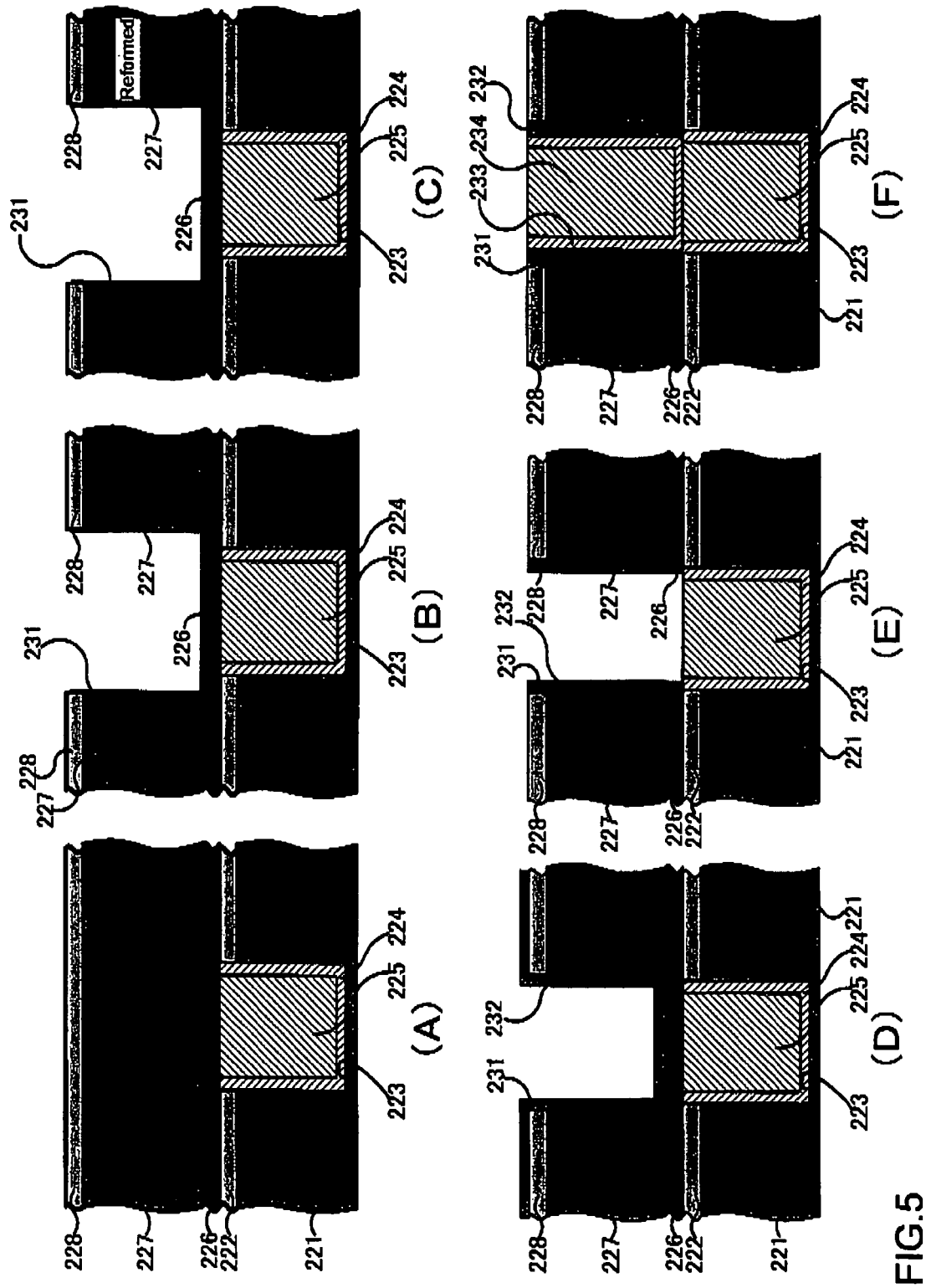
[FIG. 5] are cross-sectional views of resultant products for explaining steps of a process according to a second embodiment of the present invention.

According to the above-described embodiment, a case has been shown in FIG. 5, in which the groove 223 and the wiring opening 231 are stacked. However, the invention can be applied to a structure in which a wiring opening is arranged in a lower layer and a wiring groove is arranged in an upper layer. Further, the invention can be applied also to a dual damascene process, not a simple damascene. Further, a sealing film may be arranged on the side wall of the wiring groove 223 formed in the insulation film 221 in the lower layer.

Third Embodiment

The present invention is not limited to the above-described first and second embodiments, but can further be modified in various manners.

For example, the present invention can be applied to a series of processes of reforming of a porous film, hydrophobizing of the film by filling in the holes in the surface region, and forming of another film.

Figure 6:
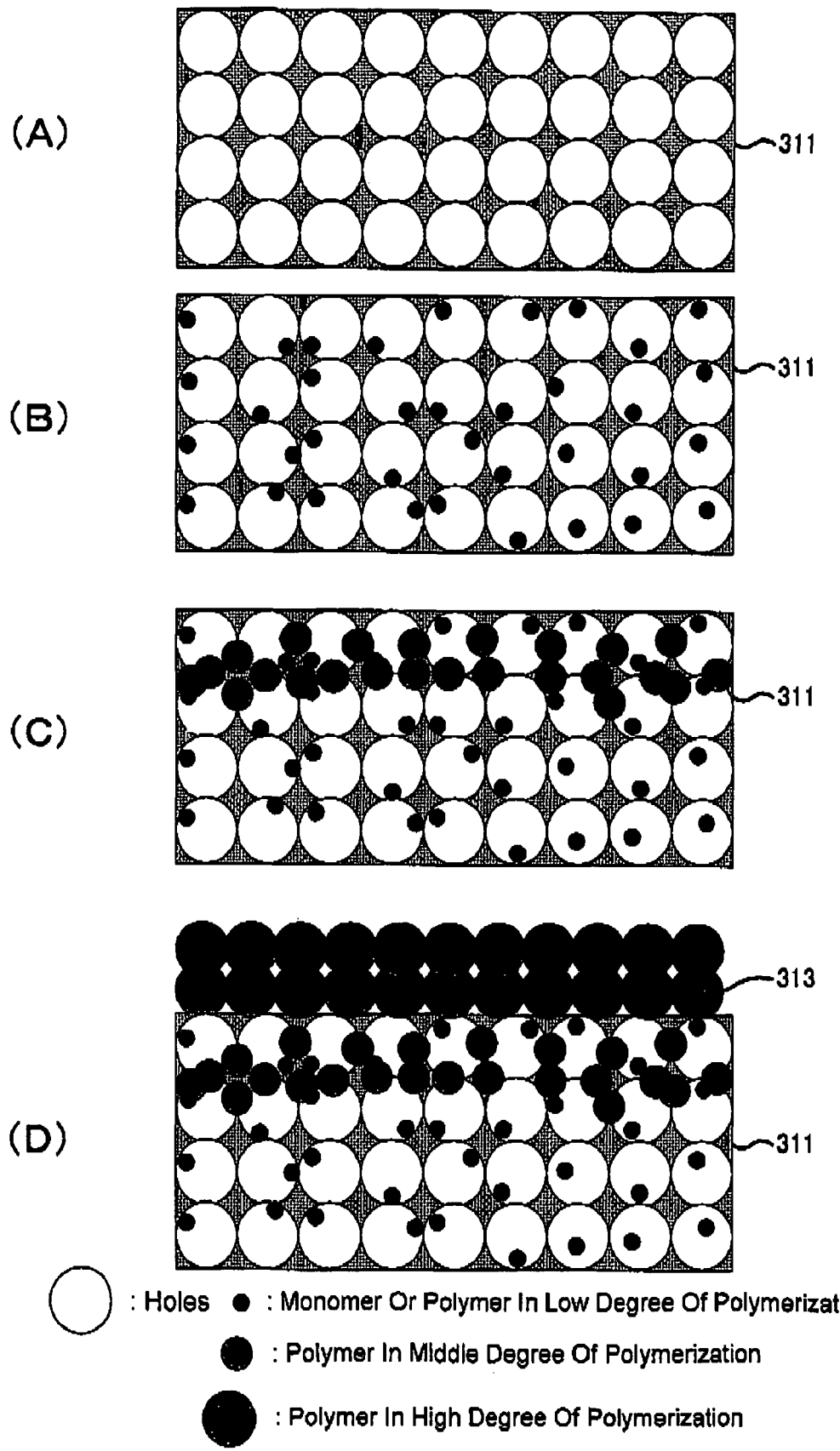
[FIG. 6] are cross-sectional views of resultant-products for explaining steps of a process according to a third embodiment of the present invention.

Such an embodiment will now be explained by using a cross-sectional model of a porous low dielectric constant firm shown in FIG. 6.

First, as shown in FIG. 6(A), a porous low dielectric constant film 311 is formed on a substrate.

Next, a heat treatment using TMCTS is performed by the CVD apparatus 111 in a similar manner as the first embodiment, to perform reforming by attaching TMCTS monomers or TMCTS polymers low in the polymerization degree (relatively low in the mean molecular weight) inside the holes in the porous low dielectric constant film 311, as shown in FIG. 6(B).

Then, the entire substrate is heated by the heater of the CVD apparatus 111 to the same extent as the heat treatment step by using a gas containing TMCTS as the atmospheric gas, and a weak high frequency power is applied to the lower electrode E and electrode plate 133. Here, the high frequency power is reduced by about 1 to 2 figures than the power used in the first embodiment. As a result, as exemplarily shown in FIG. 6(C), TMCTS polymers of a middle degree in the polymerization degree (relatively in a middle degree in the mean molecular weight) fill in the locally narrowed portions in the network of holes in the porous film, thereby sealing the region near the surface of the porous low dielectric constant film 311.

Next, the entire substrate is heated by the heater of the CVD apparatus 111 to the same extent as the heat treatment step by using a gas containing TMCTS as the atmospheric gas in a similar manner as the first embodiment, and a high frequency power of totally about 50 W is applied to the lower electrode E and electrode plate 133. As a result, polymers high in the degree of polymerization (relatively high in the mean molecular weight) are deposited on the porous firm to form an insulation film 313, as shown in FIG. 6(D).

As explained above, according to the present embodiment, reforming and sealing of a porous low dielectric constant film and forming of another insulation film on the porous low dielectric constant film can be performed by using one CVD apparatus 111 and a common reaction substance (TMCTS).

In this example, a case has been shown in which the energy to be applied is increased stepwise in the order of the process for reforming the porous low dielectric constant film, the process for sealing the region near the surface, and the process for forming an insulation film. However, the energy to be applied may be serially gradually increased. Further, the above-described reforming process, sealing process, and film forming process may be continuously performed by continuously changing not only the high frequency power but other conditions such as the density (flow ratio) of TMCTS, the temperature of the semiconductor wafer W, etc. thereby controlling the size of the TMCTS active species.

MODIFIED EXAMPLE

In the above-described embodiments, an insulation film (hard mask, sealing film) is formed by plasma CVD, but it may be formed by thermal CVD. In this case, there is no need of providing components for applying a high frequency electric field into the chamber, i.e., electrodes, high frequency power sources, matching boxes, etc. Instead, a heater and a heater controller, which are of a level capable of realizing thermal CVD, are provided.

According to the above-described embodiment, it was explained that the low dielectric film is formed by using the spin coating apparatus 101. However, the film may be a porous low electric constant film formed by the CVD apparatus. As a material gas to be supplied into the chamber of the CVD apparatus, for example, a cyclic silicon compound gas such as cyclic siloxane, cyclic silazane, etc. can be used. Further, other than a cyclic silicon compound gas, an oxygen containing substance such as $O_2, O_3, CO, CO_2, N_2O$, etc. may be used as a material. Further, the film may be a porous low dielectric constant film which is formed by supplying a silicon compound gas and a thermally unstable substance to form a film, and thereafter heating the film to a higher temperature than the film forming temperature to remove the thermally unstable substance.

The porous low dielectric constant film is not limited to the constitution shown in the above-described embodiment that includes Si and O. Further, the low dielectric constant film may be porous or may be non-porous.

Materials usable as the low dielectric constant film are, 1) a non-porous thin film containing at least Si and O as the constitutional elements, which may contain one or more of the elements C, H, N, and F, in addition to Si and O.

2) an organic thin film containing at least C and H as the constitutional elements, which may contain one or more of the elements O, F, and N, in addition to C and H.

Further, other than TMCTS, the followings can be listed as materials which are substances capable of reforming a porous silica film and also can be the material for chemical vapor deposition. These may be used.

1) Materials expected to demonstrate an effect equivalent to TMCTS a substance containing two or more Si—H bonds in the molecule, for example, monosilazane, disilane, dimethylsilane, dichlorosilane, tetraethylcyclotetrasiloxane, 1,2,3-triethyl-2,4,6-trimethylcyclotrisilazane, 1,2,3,4,5,6-hexmethylcyclotrisilazane, monomethylsilane, etc.

2) As a material from which an effect equivalent to the hydrophobizing effect of TMCTS can be expected, substances such as hexamethyldisilazane, hexamethyldisilane, hexamethyldiloxane, trimethylsilane, tetramethylsilane, dimethyldimethoxysilane, octamethylcyclotetrasiloxane, trimethoxymethylsilane, hexaethyldisilazane, hexaphenyldisilazane, heptamethyldisilazane, dipropyl-tetramethyldisilane, di-n-butyl-tetramethyldisilazane, di-n-octyl-tetramethyldisilazane, divinyl-tetramethyldisilazane, 1,1,3,3,5,5-hexamethylcyclotrisilazane, hexaethylcyclotrisilazane, hexaphenylcyclotrisilazane, octamethylcyclotetrasilazane, octaethylcyclotetrasilazane, tetraethyl-tetramethylcyclotetrasilazane, tetraphenyldimethyldisilazane, diphenyl-tetramethylsilazane, trivinyl-trimethylcyclotrisilazane, tetravinyl-tetramethylcyclotetrasilazane, etc. may be used.

3) In a case where it is desired that more weight be put on strengthening among the effects of TMCTS, tetraethoxysilane, etc. may be used.

In terms of gasification, such a substance is preferable, which contains 1 to 30 silicon atoms, preferably about 1 to 12 atoms, or more preferably 4 or less atoms like TMCTS, and which contains an element selected from hydrogen, oxygen, and nitrogen. Furthermore, such a substance is preferable, which has a characteristic of being in a gaseous state at a normal temperature under a normal pressure, or having a vapor pressure of 1 Pa to 101.3 kPa, preferably 100 Pa to 101.3 kPa at a normal temperature.

Further, the material is not limited to the above-described substances, but the substances described below are also useful.

At least one kind of cyclic siloxane expressed by

[Chemical Formula 1]

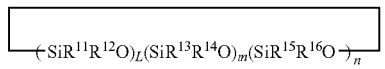

(where $R^{11}$, $R^{12}$, $R^{13}$, $R^{14}$, $R^{15}$, and $R^{16}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, L is an integer from 0 to 8, m is an integer from 0 to 8, n is an integer from 0 to 8, and $3 \leq L+m+n \leq 8$).

At least one kind of silicon compound expressed by

[Chemical Formula 2]

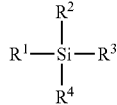

(where $R^1$, $R^2$, $R^3$ and $R^4$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, and e is an integer from 2 to 4).

At least one kind of silicon compound expressed by

[Chemical Formula 3]

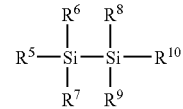

(where $R^5$, $R^6$, $R^7$, $R^8$, $R^9$, and $R^{10}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, and e is an integer from 2 to 4).

At least one kind of silicon compound expressed by

[Chemical Formula 4]

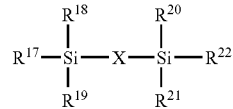

(where $R^{17}$, $R^{18}$, $R^{19}$, $R^{20}$, $R^{21}$, and $R^{22}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, X is O, $(CH_2)_f$, $C_6H_4$, $(OSiR^{23}R^{24})_nO$, $OSiR^{25}R^{26}YSiR^{27}R^{28}O$, or $NR^{29}$, where $R^{23}$, $R^{24}$ $R^{25}$, $R^{26}$, $R^{27}$, $R^{28}$, and $R^{29}$ may be the same or may be different and each represents H, OH, $C_6H_5$, $C_aH_{2a+1}$, $C_bH_{2b+1}O$, $CF_3(CF_2)_c(CH_2)_d$, $C_eH_{2e-1}$, a halogen atom, or $OSiR^{30}R^{31}R^{32}$, a is an integer from 1 to 3, b is an integer from 1 to 3, c is an integer from 0 to 10, d is an integer from 0 to 4, e is an integer from 2 to 4, f is an integer from 1 to 6, n is an integer from 1 to 10, Y represents $(CH_2)_m$ or $C_6H_4$, m is an integer from 1 to 6, and $R^{30}$, $R^{31}$, and $R^{32}$ may be the same or may be different and each represents H or $CH_3$).

At least one kind of cyclic silazane expressed by

[Chemical Formula 5]

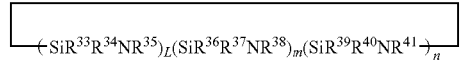

(where $R^{33}$, $R^{34}$, $R^{35}$, $R^{36}$, $R^{37}$, $R^{38}$, $R^{39}$, $R^{40}$, and $R^{41}$ may be the same or may be different, and each represents H, OH, $C_6H_5$, $C_aH_{2a+1}$, $C_bH_{2b+1}O$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, L is an integer from 0 to 8, m is an integer from 0 to 8, n is an integer from 0 to 8, and $3 \leq L+m+n \leq 8$).

It is also possible to appropriately combine 2, 3, 4 or more substances selected from the above-described substances, and use such combined substances as a material (a predetermined reaction substance) for reforming the porous low dielectric constant film and forming another insulation film. In case of mixing a plurality of gases, a mixed gas may be stored in a gas source, or the gases may be mixed in the showerhead or in the chamber.

Further, the apparatus structure and processes are not limited to the above-described embodiments.

Figure 7:
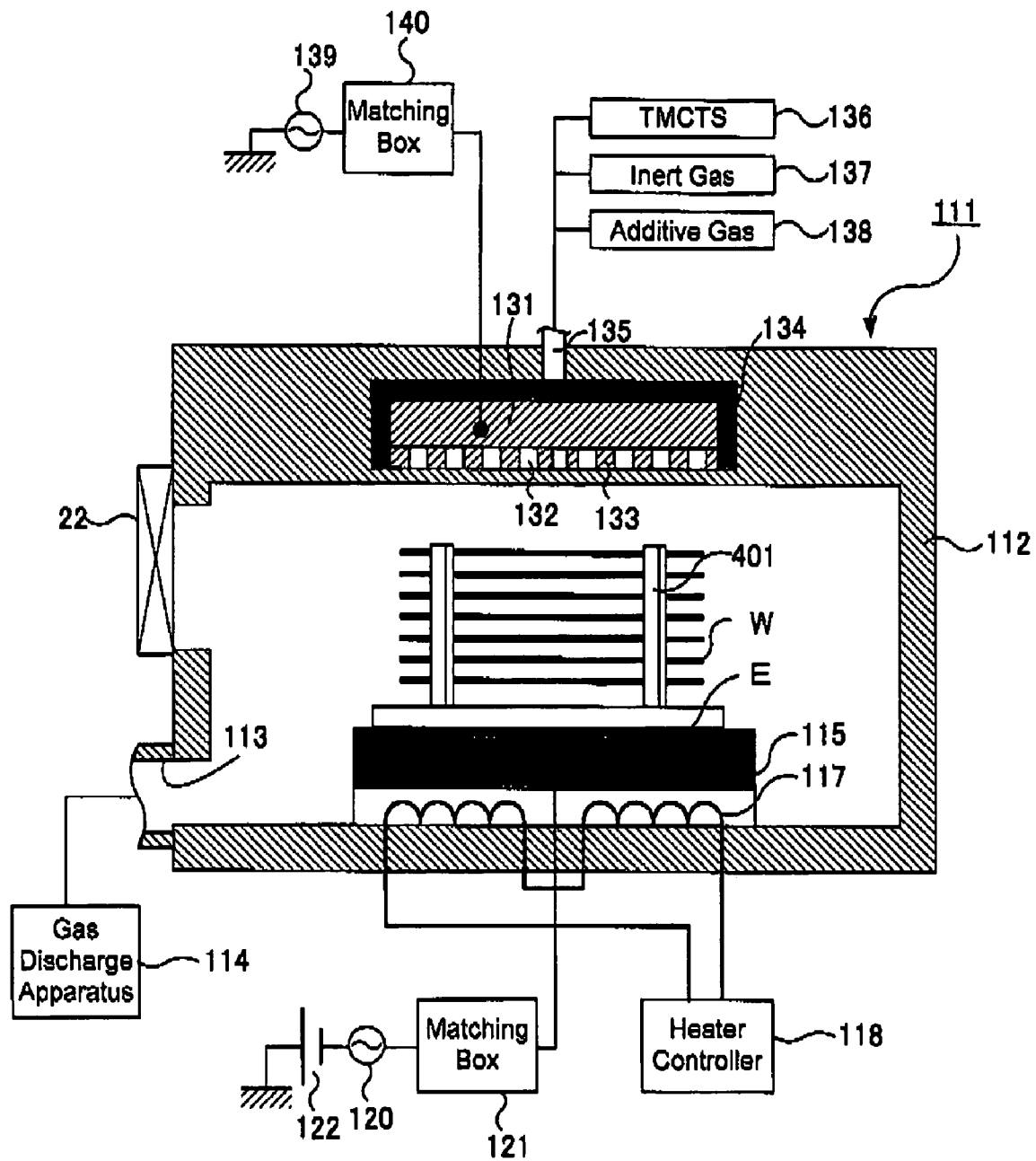
[FIG. 7] is a diagram showing another example of a CVD apparatus shown in FIG. 1.

For example, the apparatus is not limited to a single wafer processing type, but may be a batch processing apparatus. In this case, for example, as shown in FIG. 7, a plurality of semiconductor wafers W may be loaded by being placed on a boat 401 between the upper electrode (electrode plate 133) and the lower electrode E, TMCTS gas may be introduced through the showerhead or the gas inlet pipe, and the above-described processes may be performed. Further, the heater may be disposed on a side end, etc.

Further, the process target is not limited to a semiconductor wafer W, but may be a glass substrate of a liquid crystal display apparatus or a plasma display apparatus, a circuit board of a printed wiring, etc.

As explained above, according to the insulation film forming method according to a first aspect of the present invention, the reaction substance used in the heat treatment step and the reaction substance used for forming a second insulation film are the same, and the gas supply process can thus be simplified. Further, since a part of the process performed in the film forming step (the part being supplying and heating of the reaction substance) is performed in the same manner as that of the process performed in the heat treatment step, the heat treatment step and the film forming step can be performed with the use of the apparatus structure used in the film forming step (though the invention is not limited to this), contributing to simplification of the system structure and to easier control.

According to the insulation film forming method according to a second aspect of the present invention, since the reforming step and the film forming step are performed with the use of 1,3,5,7-tetramethylcyclotetrasiloxane, the gas supply process can be simplified. Further, since a part of the process performed in the film forming step (the part being supplying and heating of 1,3,5,7-tetramethylcyclotetrasiloxane) is almost the same as the process performed in the reforming step, the reforming step and the film forming step can be performed with the use of the apparatus structure used in the film forming step (though the invention is not limited to this), contributing to simplification of the system structure and to easier control.

According to the insulation film forming system according to a third aspect of the present invention, the reaction substance used in the heat treatment performed in a first chamber and the reaction substance used in the process for forming a second insulation film performed in a second chamber are the same, and the gas supply system can thus be simplified. Further, since the heat treatment performed in the first chamber is a duplicate of a heat treatment during the process of forming an insulation film performed in the second chamber, the apparatus and facilities can be shared.

Those skilled in the art could add various improvements onto the above-described embodiments without departing from the broad spirit and scope of the invention. The above-described embodiments are intended to illustrate the present invention, not to limit the scope of the present invention. Accordingly, the scope of the present invention should be determined not by referring to the above description, but in accordance with the entire scope of equivalents to which the claims shown below are entitled.

This application is based on Japanese Patent Application No. 2003-399827 filed on Nov. 28, 2003 and including specification, claims, drawings and summary. The disclosure of the above Japanese Patent Application is incorporated herein by reference in its entirety.

INDUSTRIAL APPLICABILITY

The present invention is applicable to manufacturing of a semiconductor device, a liquid crystal display apparatus, etc., and to a circuit board of a printed wiring, etc.

The invention claimed is:

1. An insulation film forming method, comprising:
a heat treatment step of heating a first insulation film in an atmosphere containing a silicon-containing reaction substance; and
a film forming step of forming a second insulation film on said first insulation film subjected to a heat treatment in said heat treatment step, by chemical vapor deposition using a gas containing said reaction substance.

2. The insulation film forming method according to claim 1,
wherein said film forming step comprises a step of causing chemical vapor deposition by exciting said reaction substance by an energy higher than that for exciting said reaction substance in said heat treatment step.

3. The insulation film forming method according to claim 1 or 2,
wherein in said heat treatment step, said first insulation film is subjected to the heat treatment in an atmosphere containing no plasma, and in said film forming step, a plasma of the gas containing said reaction substance is generated to perform chemical vapor deposition.

4. The insulation film forming method according to claim 1,
wherein:
said first insulation film is formed of a porous insulation film;
said heat treatment step comprises a reforming step of reforming said porous insulation film by causing said reaction substance to combine with said porous insulation film; and
said film forming step comprises a step of placing said reformed first insulation film in the atmosphere containing said reaction substance to heat said first insulation film, and generating a plasma of the gas containing said reaction substance to cause chemical vapor deposition of said reaction substance on said first insulation film.

5. The insulation film forming method according to claim 1,
wherein said reaction substance comprises a substance containing silicon and hydrogen.

6. The insulation film forming method according to claim 5,
wherein said reaction substance comprises a substance containing two or more silicon-hydrogen bonds.

7. The insulation film forming method according to claim 1,
wherein said reaction substance comprises a substance containing 1 to 30 silicon atoms, and an element obtained from hydrogen, oxygen, and nitrogen.

8. The insulation film forming method according to claim 5,
wherein said reaction substance is at least one kind of cyclic siloxane expressed by

[Chemical Formula 1]

where $R^{11}, R^{12}, R^{13}, R^{14}, R^{15}$, and $R^{16}$ may be the same or may be different, and each represents H, OH, $C_6H_5$, $C_aH_{2a+1}$, $C_bH_{2b+1}$, $CF_3(CF_2)_c(CH_2)_d$, $C_eH_{2e-1}$, or a halogen atom, a is an integer from 1 to 3, b is an integer from 1 to 3, c is an integer from 0 to 10, d is an integer from 0 to 4, e is an integer from 2 to 4, L is an integer from 0 to 8, m is an integer from 0 to 8, n is an integer from 0 to 8, and $3 \leq L+m+n \leq 8$.

9. The insulation film forming method according to claim 5,
wherein said reaction substance is 1,3,5,7-tetramethylcyclotetrasiloxane.

10. The insulation film forming method according to claim 1,
wherein said first insulation film is formed of a porous insulation film containing silicon.

11. The insulation film forming method according to claim 1,
wherein:
said first insulation film constitutes an interlayer insulation film of a semiconductor device; and
said second insulation film constitutes an insulation film, which is higher in at least one of hardness and density than said first insulation film.

12. The insulation film forming method according to claim 1,
wherein said heat treatment step includes a step of changing a mean molecular weight of said reaction substance in the atmosphere, along with elapse of a time for heat treatment.

13. The insulation film forming method according to claim 1,
further comprising a second heat treatment step of subjecting said first insulation film to a heat treatment by exciting said reaction substance by an energy higher than an energy for exciting said reaction substance in said heat treatment step,
wherein in said film forming step, said second insulation film is formed on said first insulation film, which has been subjected to the heat treatment in said second heat treatment step, by exciting said reaction substance by an energy higher than the energy for exciting said reaction substance in said second heat treatment step.

14. The insulation film forming method according to claim 1,
wherein said first insulation film, which is a process target of the heat treatment in said heat treatment step, is formed of a porous insulation film formed by spin coating, or a porous insulation film formed by chemical vapor deposition.

15. An insulation film forming method, comprising:
a reforming step of reforming a porous film containing silicon by heating said porous film while placing it in an atmosphere containing 1,3,5,7-tetramethylcyclotetrasiloxane; and
a film forming step of placing said reformed porous film in the atmosphere containing 1,3,5,7-tetramethylcyclotetrasiloxane, and forming an insulation film higher in at least one of hardness and density than said reformed porous film on said porous film, by chemical vapor deposition using a gas containing the 1,3,5,7-tetramethylcyclotetrasiloxane.

16. The insulation film forming method according to claim 15,
wherein:
in said reforming step, a plasma of the atmosphere gas containing 1,3,5,7-tetramethylcyclotetrasiloxane is not generated; and
in said film forming step, a plasma is generated in the gas containing 1,3,5,7-tetramethylcyclotetrasiloxane to perform chemical vapor deposition.

17. An insulation film forming method, comprising:
a heat treatment step of placing a process target substrate on which a first insulation film is formed in a chamber, supplying a gas containing a silicon-containing reaction substance into said chamber, and heating said first insulation film; and
a film forming step of generating a plasma of a gas containing said reaction substance in said chamber, and forming a second insulation film on said first insulation film subjected to a heat treatment in said heat treatment step, by causing chemical vapor deposition of said reaction substance excited in said plasma.

18. An insulation film forming system, comprising:
a first chamber, a first support member arranged inside said first chamber for supporting a process target, a first heater which heats the process target supported by said first support member;
first gas supply means for supplying a gas containing a silicon-containing reaction substance into said first chamber;
first control means for introducing the gas containing said reaction substance into said first chamber by said first gas supply means in a state where a first insulation film is placed on said first support member, and heating said first insulation film by said first heater;
a second chamber, a second support member arranged inside said second chamber for supporting a process target, a second heater which heats the process target supported by said second support member;
second gas supply means for supplying a gas containing said reaction substance into said second chamber; and
second control means for introducing the gas containing said reaction substance into said second chamber by said second gas supply means in a state where said first insulation film is supported on said second support member, and forming a second insulation film containing a product of said reaction substance on said first insulation film.

19. The insulation film forming system according to claim 18,
further comprising plasma generation means for generating a plasma of the gas containing said reaction substance in said second chamber,
wherein said second control means introduces the gas containing the reaction substance into said second chamber by said second gas supply means in a state where said first insulation film is placed on said second support member, heats said first insulation film by said second heater, and generates a plasma of the gas containing said reaction substance by said plasma generation means, thereby forming the second insulation film containing the product of said reaction substance on said first insulation film.

20. The insulation film forming system according to claim 18,
wherein:
said first and second chambers are physically constituted by a single chamber;
said first and second support members are physically constituted by a single support member;
said first and second heaters are physically constituted by a single heater;
said first and second control means are physically constituted by a common control unit;
said single chamber comprises high frequency electric field applying means for applying a high frequency electric field to a gas introduced into said single chamber;
said control unit comprises means for controlling said high frequency electric field applying means so as not to apply a high frequency electric field to the gas at a time of heat treatment, and to apply a high frequency electric field at a time of film formation; and
said system is capable of performing heat treatment on said first insulation film and forming said second insulation film on said first insulation film subjected to the heat treatment, by a single set of components.

21. An insulation film forming system, comprising:
a plurality of chambers;
conveying means for conveying a process target into one of said plurality of chambers to place it therein;
gas supply means for supplying a gas containing a silicon-containing reaction substance into one of said plurality of chambers in which the process target is placed by said conveying means;
heating means for subjecting a first insulation film formed on the process target to a heat treatment by heating the process target placed in one of said plurality of chambers in an atmosphere of the gas supplied by said gas supply means;
plasma generation means for generating a plasma of the gas containing said reaction substance in one of said plurality of chambers, in which the process target, having thereon said heat-treated first insulation film, is placed; and
film forming means for forming a second insulation film on said first insulation film on the process target heated by said heating means, by chemical vapor deposition using the plasma generated by said plasma generation means.

22. A semiconductor device manufacturing method, comprising:
a step of preparing a substrate in which a metal wiring is embedded;
a step of forming a first insulation film on said substrate;
a step of forming a wiring opening in which a metal wiring is to be formed via a barrier metal, in said first insulation film;
a reforming step of reforming said first insulation film so as to decrease migration of said barrier metal into said first insulation film;
a film forming step of forming a second insulation film, which covers said reformed first insulation film; and
a step of forming a metal wiring in said wiring opening via said second insulation film and said barrier metal, and jointing said formed metal wiring to said embedded metal wiring.

23. The semiconductor device manufacturing method according to claim 22,
wherein said second insulation film constitutes an insulation film which is higher in at least one of hardness and density than said reformed first insulation film.

24. The semiconductor device manufacturing method according to claim 22,
wherein:
in said reforming step, said first insulation film is subjected to a heat treatment in an atmosphere containing a silicon-containing reaction substance; and
in said film forming step, said second insulation film is formed by chemical vapor deposition using a gas containing said reaction substance.

* * * * *